(12) United States Patent
Allen et al.

(10) Patent No.: US 7,289,659 B2
(45) Date of Patent: Oct. 30, 2007

(54) METHOD AND APPARATUS FOR MANUFACTURING DIAMOND SHAPED CHIPS

(75) Inventors: Robert J. Allen, Jericho, VT (US); John M. Cohn, Richmond, VT (US); Scott W. Gould, South Burlington, VT (US); Peter A. Habitz, Hinesburg, VT (US); Juergen Koehl, Weil im Schoenbuch (DE); Gustavo E. Tellez, Essex Junction, VT (US); Ivan L. Wemple, Shelburne, VT (US); Paul S. Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 844 days.

(21) Appl. No.: 10/250,295

(22) Filed: Jun. 20, 2003

(65) Prior Publication Data
US 2004/0258294 A1    Dec. 23, 2004

(51) Int. Cl.
G06K 9/00    (2006.01)
(52) U.S. Cl. .................... 382/145; 382/151
(58) Field of Classification Search ........ 382/144–147, 382/151; 355/53
See application file for complete search history.

(56) References Cited

U.S. PATENT DOCUMENTS 5,055,871 A * 10/1991 Pasch .................... 355/53

FOREIGN PATENT DOCUMENTS

EP    0583625 A2 *   2/1994

* cited by examiner

*Primary Examiner*—Duy M. Dang
(74) *Attorney, Agent, or Firm*—Ryan K. Simmons; Dugan & Dugan, PC

(57) ABSTRACT

In a first aspect, an inventive apparatus for imaging a chip on a wafer includes a combined diamond chip image and kerf image having a plurality of sloped sides. The combined diamond chip image and kerf image includes a diamond chip image comprising a plurality of chip image rows that are parallel to at least one diagonal of the diamond chip image, and includes a kerf image adjacent to the diamond chip image. The kerf image comprises at least one kerf image row that is parallel to the at least one diagonal of the diamond chip image. The apparatus further includes a blocking material extending from the combined diamond chip image and kerf image to at least a periphery of an exposure field of a stepper. In a second aspect the imaging apparatus comprises an n-sided polygon-shaped combined chip image and kerf image. Also provided are inventive methods of manufacturing chips, and wafers manufactured in accordance with the inventive methods.

23 Claims, 10 Drawing Sheets

METHOD AND APPARATUS FOR MANUFACTURING DIAMOND SHAPED CHIPS

BACKGROUND OF INVENTION

1. Field of the Invention

The present invention relates generally to integrated circuit manufacturing, and more particularly to a method and apparatus for manufacturing diamond shaped chips.

2. Background

During integrated circuit (chip) manufacturing, a plurality of chips may be created on a wafer. A mask may be used in conjunction with conventional lithographic processes to manufacture each chip. More specifically, a portion of the wafer may be illuminated through the mask. The mask is a device that includes a pattern which selectively allows illumination of materials (e.g., photoresist) on portions of the wafer and selectively blocks illumination to other portions of the wafer, thereby creating a circuit based upon the pattern of the mask. More specifically, the pattern may include a chip image. The chip image includes chip image rows which include transistor logic devices of a certain orientation (device orientation) and which will govern the wiring direction of the chip to be manufactured.

Tools (e.g., steppers) are conventionally used to "step" (i.e., create) a chip on a portion of the wafer. The stepper then moves in a certain direction and repeats this process to create a plurality of chips on the wafer. Steppers that move only in a horizontal and vertical direction are more accurate than steppers that move in diagonal directions.

The shape of the chip image selected to be included in the mask must allow for efficient placement of a chip on a wafer (i.e., wasting as little space on the wafer as possible).

As mentioned above, because steppers traditionally use horizontal and/or vertical movements to step chips on a wafer, use of a mask with a square or rectangular chip image may save valuable space on the wafer. FIGS. 1 and 2 show exemplary masks used by a conventional stepper. FIG. 1 is an exemplary block diagram of a mask 100 that is conventionally used to create a chip on a wafer. The mask 100 includes a rectangular chip image 102 and a kerf image 104. The chip image 102 includes information about the wiring direction and/or the device orientation 106 of the chip to be manufactured. Because the chip image rows and device orientation in both the rectangular and square chip images of the mask shown in FIG. 1 will be in rows that are parallel to a side of the chip image, the circuit 106 of the chip created from the mask 100 shown in FIG. 1 will be parallel to a side of the chip image 102.

The kerf image 104 may contain circuitry that, among other things, may be used to gather parametric data about the chip, etc. The mask 100 includes blocking material 108 coupled to the chip image 102 and the kerf image 104. The blocking material 108 may be used to prevent portions of an irradiator exposure field of a stepper from reaching portions of a wafer on which chips other than the chip being presently illuminated, are to be created. FIG. 2 is an exemplary block diagram of an alternate mask 200 that includes a square chip image 202, a kerf image 204 and blocking material 208. The mask 200 is identical to the mask of FIG. 1 except the blocking material 208 does not surround the chip image. The blocking material 208 of mask 200 extends from each side of the mask 200, but does not extend beyond the corners thereof.

Conventionally, using one of the masks shown in FIGS. 1 and 2, a stepper may create a chip, move a distance horizontally and create another chip. By repeating this process, the stepper may create a series of chips in a horizontal row, which has an overall rectangular shape. The stepper may then move vertically and create another horizontal row of chips, on top of the previously created row, which also has an overall rectangular shape.

Alternate chip shapes may provide advantages. A diamond shaped chip with horizontal chip image rows provides a shorter maximum wiring length and a shorter average wiring length. Thus, an apparatus for creating a diamond shaped chip is desired, as are methods for manufacturing diamond-shaped chips using conventional steppers and wiring equipment.

SUMMARY OF INVENTION

In a first aspect, an inventive apparatus for imaging a chip on a wafer includes a combined diamond chip image and kerf image having a plurality of sloped sides. The combined diamond chip image and kerf image includes a diamond chip image comprising a plurality of chip image rows that are parallel to at least one diagonal of the diamond chip image, and includes a kerf image adjacent to the diamond chip image. The kerf image comprises at least one kerf image row that is parallel to the at least one diagonal of the diamond chip image. The apparatus further includes a blocking material extending from the combined diamond chip image and kerf image to at least a periphery of an exposure field of a stepper. In one aspect, the kerf image may be located along two adjacent sides of the diamond chip image. Preferably, the chip image rows create a stair-step pattern at an edge of the chip.

In a second aspect, an inventive apparatus for imaging a chip on a wafer includes an n-sided polygon-shaped combined chip image and kerf image, where n is an even number. The combined chip image and kerf image includes an n-sided polygon-shaped chip image comprising one or more rows that are parallel to a first diagonal of the n-sided polygon chip image, wherein the first diagonal is either horizontal or vertical. The n-sided polygon chip image has a plurality of sloped sides. The combined chip image and kerf image also includes a kerf image adjacent to the n-sided polygon-shaped chip image, wherein the kerf image comprises one or more kerf image rows that are parallel to the first diagonal. A blocking material extends from the combined n-sided polygon-shaped chip image and kerf image to a periphery of an exposure field of a stepper.

Also provided is an inventive method of manufacturing chips. In a first aspect, an inventive method of manufacturing chips comprises moving an apparatus for imaging a chip to a plurality of selected portions of the wafer, illuminating each of the plurality of selected portions of the wafer through the apparatus to thereby create a plurality of diamond-shaped chips; wherein a first diagonal of each chip is horizontal; a second diagonal of each chip is vertical; and a first and a second adjacent row of chips are placed such that a portion of a chip in the second row occupies a space created between two adjacent chips in the first row.

In a second method aspect, an inventive method of manufacturing chips comprises moving an apparatus for imaging a chip to a plurality selected portions of the wafer, illuminating each of the plurality of selected portions of the wafer through the apparatus to create a plurality of n-sided polygon-shaped chips; wherein a centerline of each chip is horizontal or vertical and a first diagonal of each chip is horizontal or vertical.

A final aspect includes a wafer having either a plurality of diamond-shaped chips, or a plurality of n-sided polygon-shaped chips made in accordance with the above described method.

Other features and aspects of the present invention will become more fully apparent from the following detailed description, the appended claims and the accompanying drawings.

DETAILED DESCRIPTION

Figure 2:
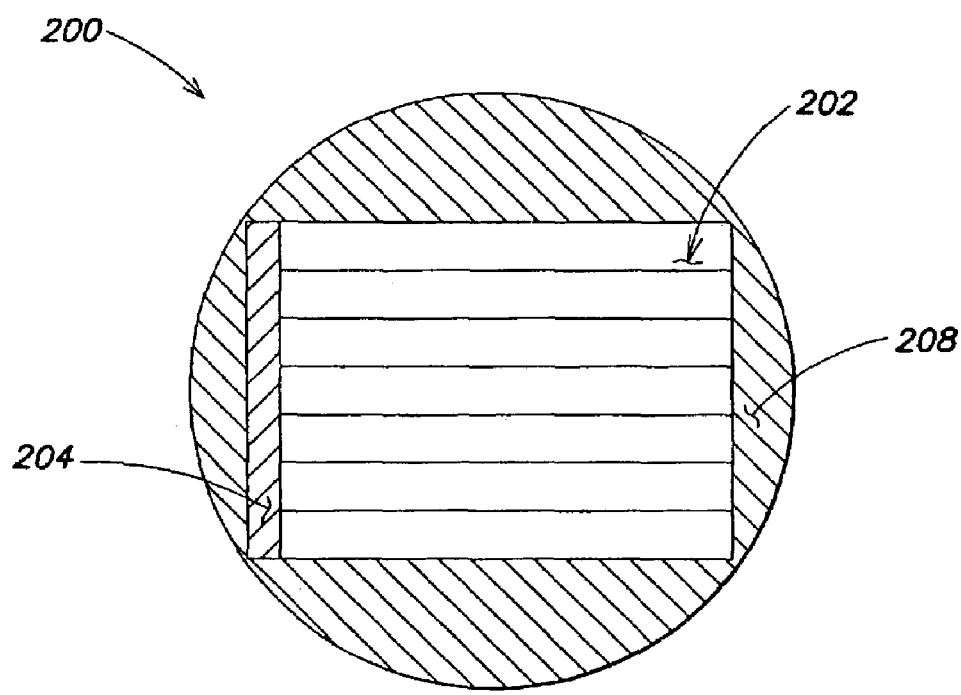
Figure 3:
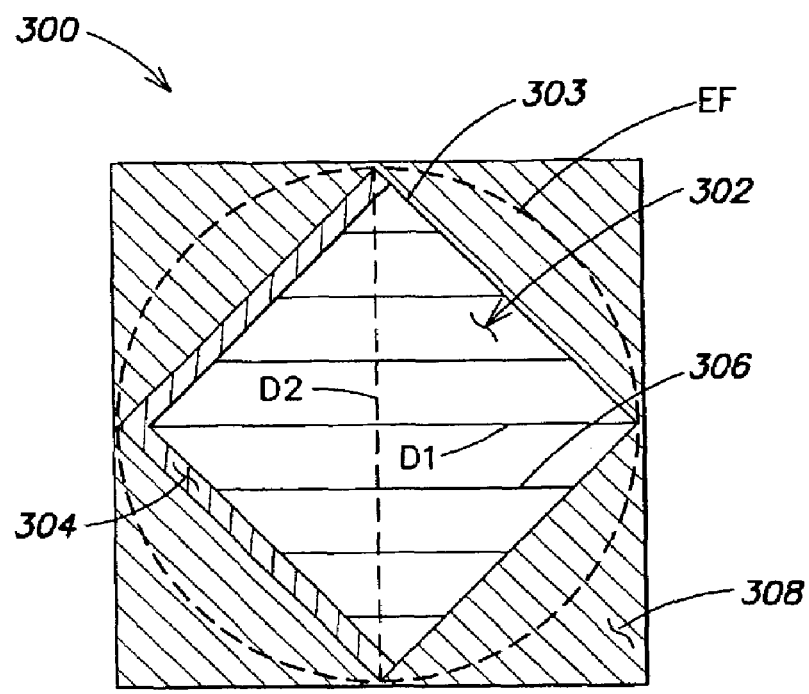
FIG. 3 is a block diagram of an exemplary mask of the present invention.

FIG. 3 is a block diagram of an exemplary mask 300 of the present invention. The mask 300 includes a diamond-shaped chip image 302, which has sloped sides 303. The diamond-shaped chip image 302 may have a first diagonal D1 that is horizontal and a second diagonal D2 that is vertical. As stated above, the chip image 302 includes chip image rows 306 which include transistors or logic devices of a certain orientation (device orientation) and which will govern the wiring direction of the chip to be manufactured. In contrast to the chip image 102, 202 shown in FIGS. 1 and 2, the chip image 302 may have sloped sides, (e.g., may be a square rotated by 45 Å°). However, unlike the chip image rows and/or device orientation of the chip image 102, 202 of FIGS. 1-2, the chip image rows and device orientation of the chip image 302 included in the inventive mask 300 is parallel to at least one of the first and second diagonals D1, D2. The circuits are included in horizontal or vertical chip image rows. For example, in the chip image 302 shown in FIG. 3, the device orientation is in horizontal rows 306. Because of the diamond shape of the chip image 302, a plurality of chip image rows of circuits creates a stair-step pattern at the edges of the chip. The mask above provides an advantage over using the mask of FIGS. 1 and 2 rotated by 45 Å°, because the transistors created using such a rotated mask would be angled. If the transistors are angled, the error imparted to the transistor geometries is increased. Therefore, transistors that are orthogonal or parallel to the direction of the stepper movement are desired.

The mask 300 includes a kerf image 304 adjacent to one or more sides of the diamond-shaped chip image 302. For example, the kerf image 304 shown in FIG. 3 is along two adjacent sides of the left half of the diamond chip image 302 and forms an L-shape. As mentioned above, the kerf image 304 may include circuitry used to, among other things, gather parameter data from the corresponding chip created by the mask 300. The device orientation included in the kerf image 304 may have the same orientation as the device orientation inside the diamond shaped chip, which, as previously stated, may be parallel to the first or second diagonal of the diamond-shaped chip image 302. The circuits are included in horizontal or vertical kerf image rows (not shown).

The mask 300 includes a blocking material 308 (e.g., chrome) that extends from the combined diamond-shaped chip image 302 and kerf image 304 to at least a periphery of an exposure field of a stepper. Note that conventional exposure fields are circular (as indicated by the dashed circle EF). Thus, the blocking material 308 extends beyond the exposure field EF. In contrast to the blocking material 108, 208 in the masks 100 and 200 shown in FIGS. 1 and 2, the blocking material 308 of the mask 300 extends from the sloped sides 303 of the combined diamond-shaped chip image 302 and kerf image 304.

Figure 4:
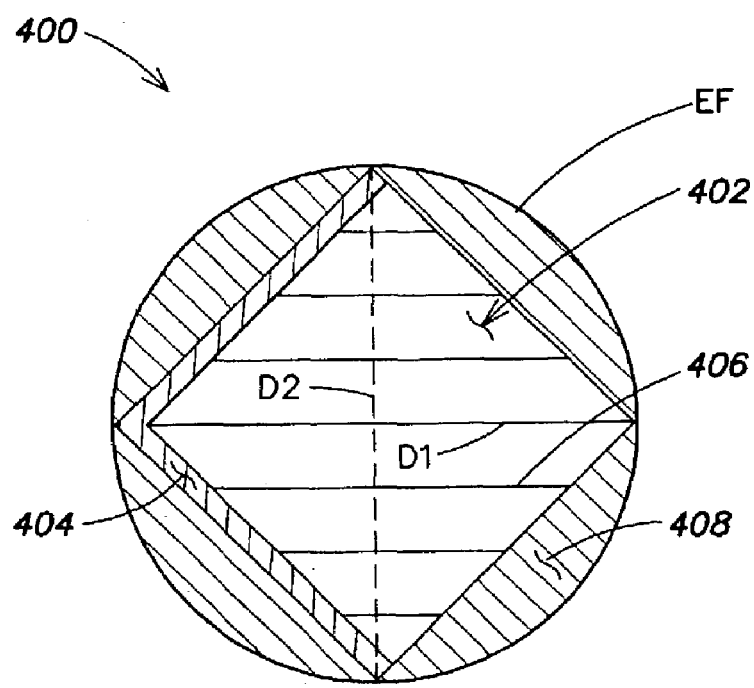
FIG. 4 is a block diagram of an alternate mask of the present invention.

FIG. 4 is a block diagram of an alternate mask 400 of the present invention. The mask 400 includes a diamond-shaped chip image 402 and a kerf image 404 similar to the mask 300 shown in FIG. 3. However, the shape of the mask 400 (e.g., round) is different from the shape of the mask 300 (e.g., rectangular) due to a difference in the shape of the blocking material used in each mask. The mask 400 includes blocking material 408 that extends from the combined diamond chip image 402 and kerf image 404 to a periphery of an exposure field EF of a stepper. Note that in the embodiment of FIG. 4 the blocking material 408 extends only to the periphery of the circular exposure field EF.

Figure 5:
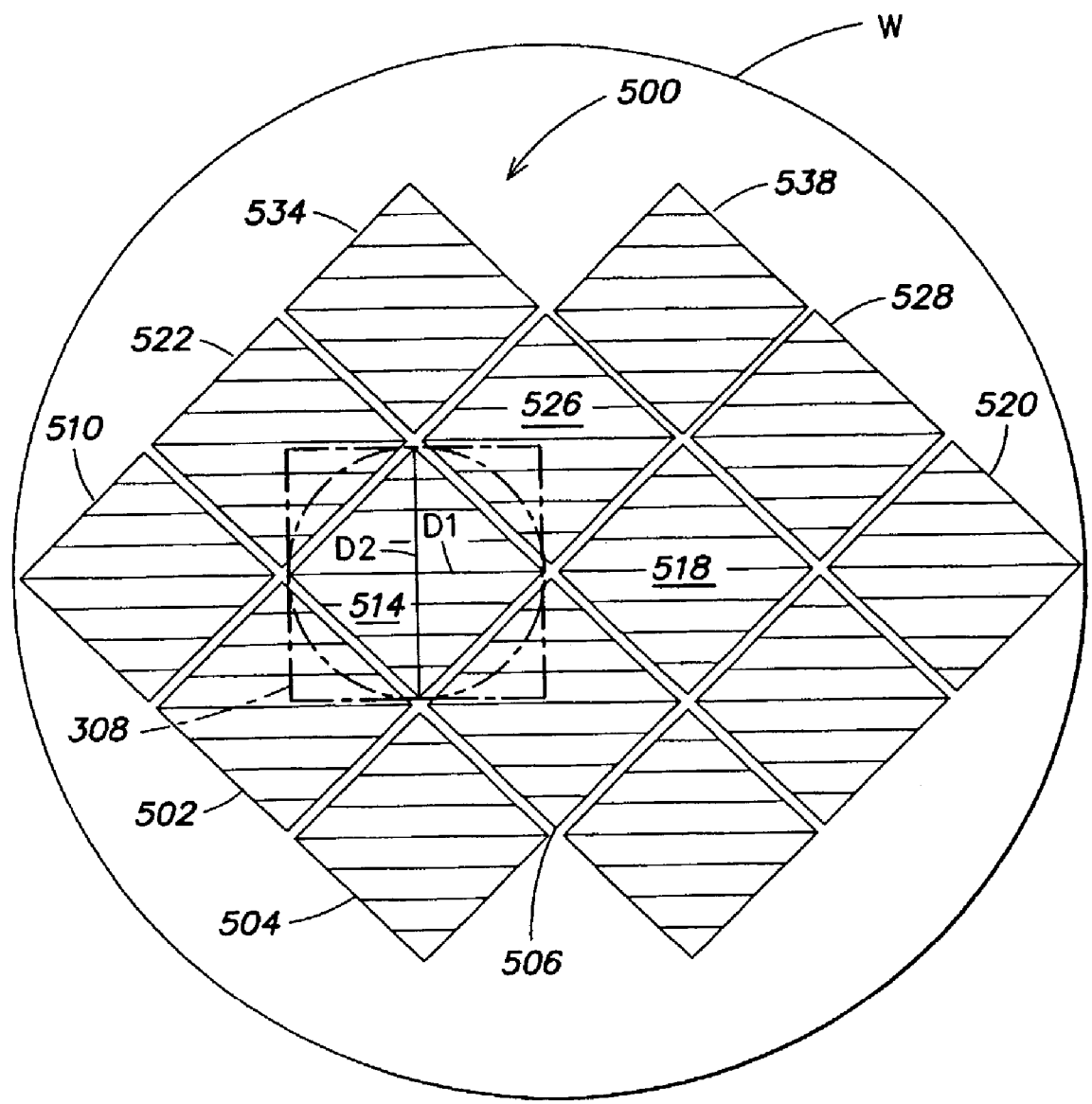
FIG. 5 is a schematic diagram of a wafer having a plurality of chips formed thereon via the inventive mask of FIG. 3 or 4.

The masks shown in FIGS. 3 and 4 may be employed in a method of manufacturing chips to create a plurality of chips on a wafer W with a layout 500 as shown in FIG. 5. A plurality of methods may be used to create chips on a wafer with the above layout 500. Examples are as follows:

(1) Create a row of chips on a wafer, move the stepper to an appropriate position on the wafer, and create another row of chips, so as to create chip 510, then create chip 514, then create chip 518, then create 520, then create chip 528, then create chip 526 and then create chip 522.

(2) Create a column of chips on a wafer, move the stepper to an appropriate position on the wafer, and create another column of chips, so as to create chip 502, then create chip 522, then create chip 534, then create chip 514, and then create chip 504.

(3) Create a diagonal row (or column) of chips on a wafer, move the stepper to an appropriate position on the wafer, and create another diagonal row (or column) of chips, so as to create chip 510, then create chip 522, then create chip 534, then create chip 526, then create chip 514 and then create chip 502.

(4) Create a zigzag row (or column) of chips on a wafer, move the stepper to an appropriate position of the wafer, and create another zigzag row (or column) of chips, so as to create chip 510, then create chip 522, then create chip 514, then create chip 526, then create chip 518 and then create chip 528 (or so as to create chip 502, then create chip 514, then create chip 522, and then create chip 534).

Figure 6:
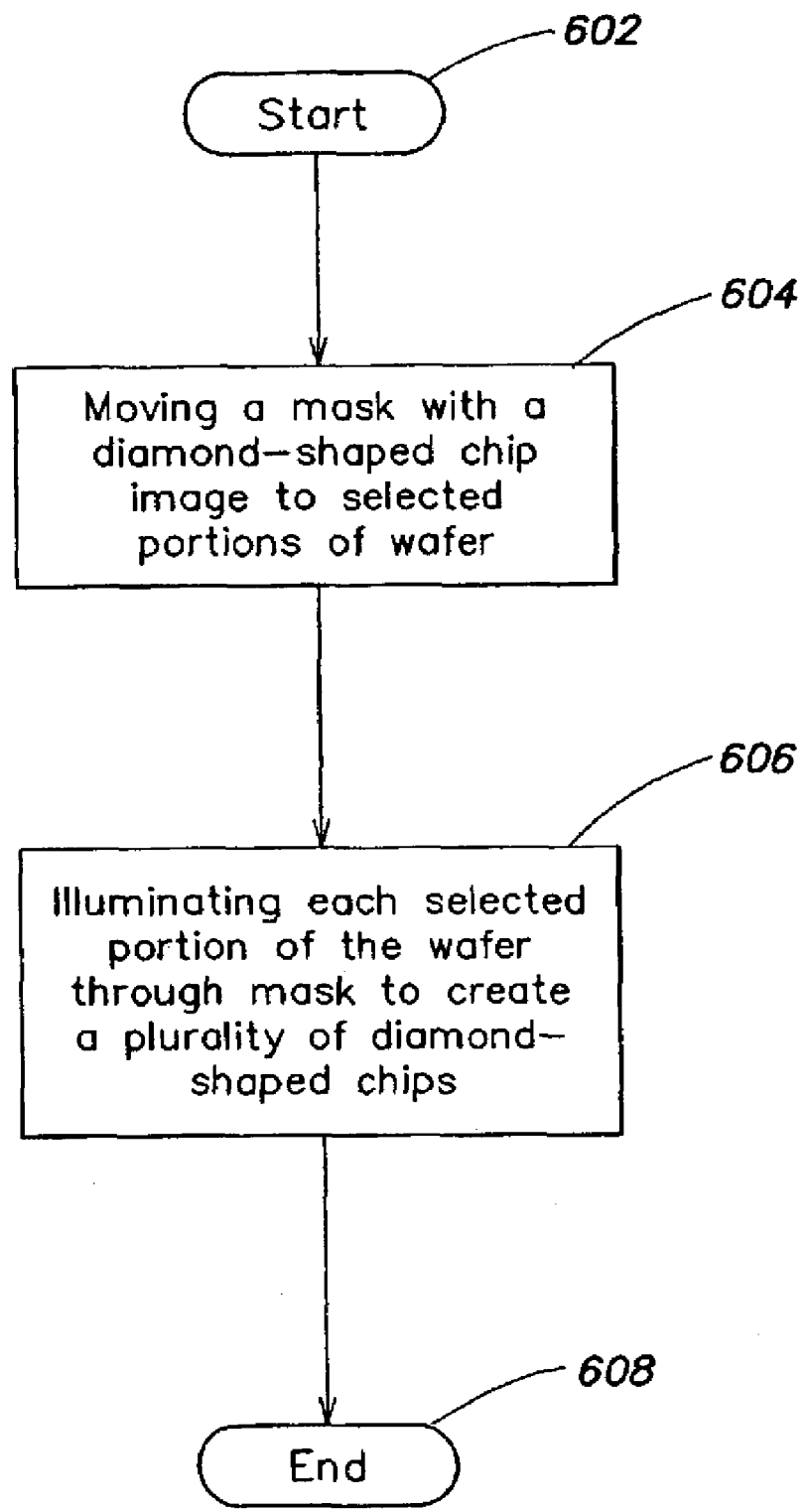
FIG. 6 is a flow chart describing an inventive method of imaging chips on a wafer.

The use of the inventive mask 300, 400 is now described with reference to FIGS. 3-5, and with reference to FIG. 6, which illustrates a method of manufacturing chips. With reference to FIG. 6, in step 602, the method of manufacturing chips begins. In step 604, a mask with a diamond-shaped chip image 300, 400 is moved to a plurality of selected portions of a wafer. A selected portion is a portion of the wafer upon which a chip is to be created. In this method of manufacturing chips on a wafer, the mask 300, 400 may be moved using conventional stepper movements (e.g., purely vertical and/or purely horizontal movements). Therefore, this method may be performed using a conventional stepper. For example, referring to FIG. 5, in order to create a zigzag column of chips, after creating chip 502, the stepper would be moved to a selected portion 514 using a horizontal and a vertical movement sequence. After chip 514 is created, the stepper would be moved to selected portion 522 using a horizontal and a vertical movement sequence. After chip 522 is created, the stepper would be moved to selected portion 534 using a horizontal and a vertical movement sequence, and so on.

In step 606, each of the plurality of selected portions of the wafer is illuminated through the mask to create a plurality of closely packed diamond-shaped chips. A selected portion of the wafer may be illuminated through the mask 300, 400 after the mask 300, 400 has been moved to that selected portion. When a selected portion of the wafer is illuminated through the mask to create a chip, the blocking material 308, 408 is employed to prevent illumination from a portion of the stepper's exposure field from reaching the wafer. For example, referring to FIGS. 3 and 5, if mask 300 is employed to illuminated a selected portion of the wafer so as to create chip 514, the blocking material 308 may be used to prevent portions of the wafer (e.g., a portion of the wafer occupied by each of chips 522, 502, 526 and 506) from being exposed to illumination (as shown in phantom as 308 on FIG. 5).

In one embodiment, a first diagonal D1 of the diamond-shaped chip image 302 included in the mask 300 may be horizontal and a second diagonal D2 may be vertical. When a mask including such a chip image 302 is moved to a plurality of selected portions of the wafer and each of the plurality of selected portions are illuminated through the mask a plurality of closely-packed diamond-shaped chips with the layout shown in FIG. 5 may be created. More specifically, a first and second adjacent row (or column) of chips are meshed or interlocked such that a portion of a chip in the first row (or column) occupies a space created between two adjacent chips in the second row (or column). In step 608, the method of FIG. 6 ends.

Figure 1:
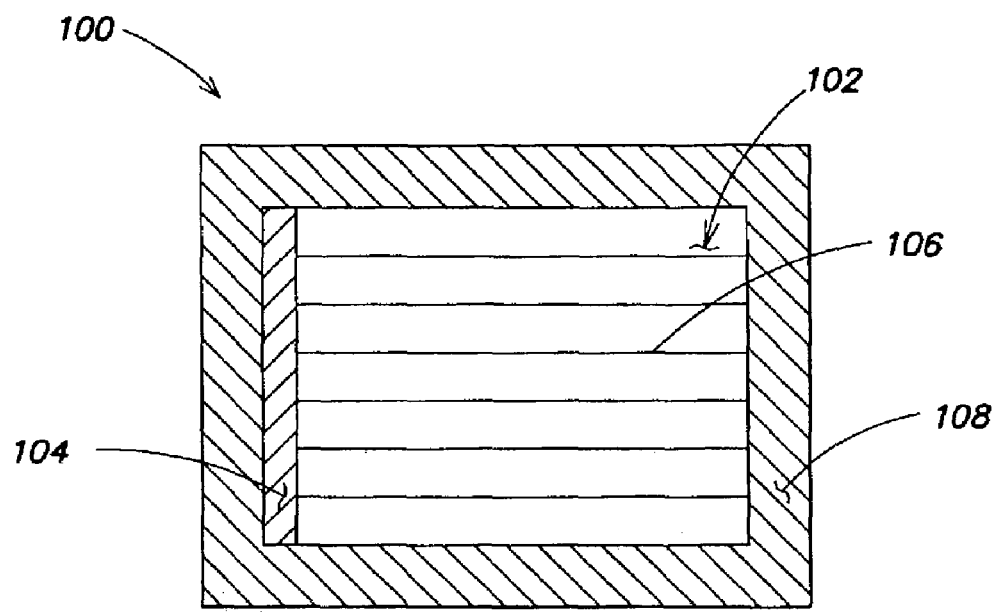
FIGS. 1 and 2 show exemplary masks used by a conventional stepper.

Employing the mask 300, 400 in the manufacturing of chips creates chips with horizontal or vertical rows of circuits such as those created by the masks of FIGS. 1-2. However, the wiring, device orientation and/or rows of circuits (or chip image rows) of the chips will be parallel to one of the diagonals of the chip image and therefore, the maximum and average wiring length of each chip is reduced as compared to the chips created using conventional masks 100, 200. An advantage of reducing maximum and average wire lengths is a faster distribution of signals to all parts of the chip. Also, employing the mask 300, 400 in method of manufacturing chips may create chips with a greater number of tracks for a first vertical or horizontal cut. The greater number of cuts provides the advantage of less chip congestion.

Figure 7:
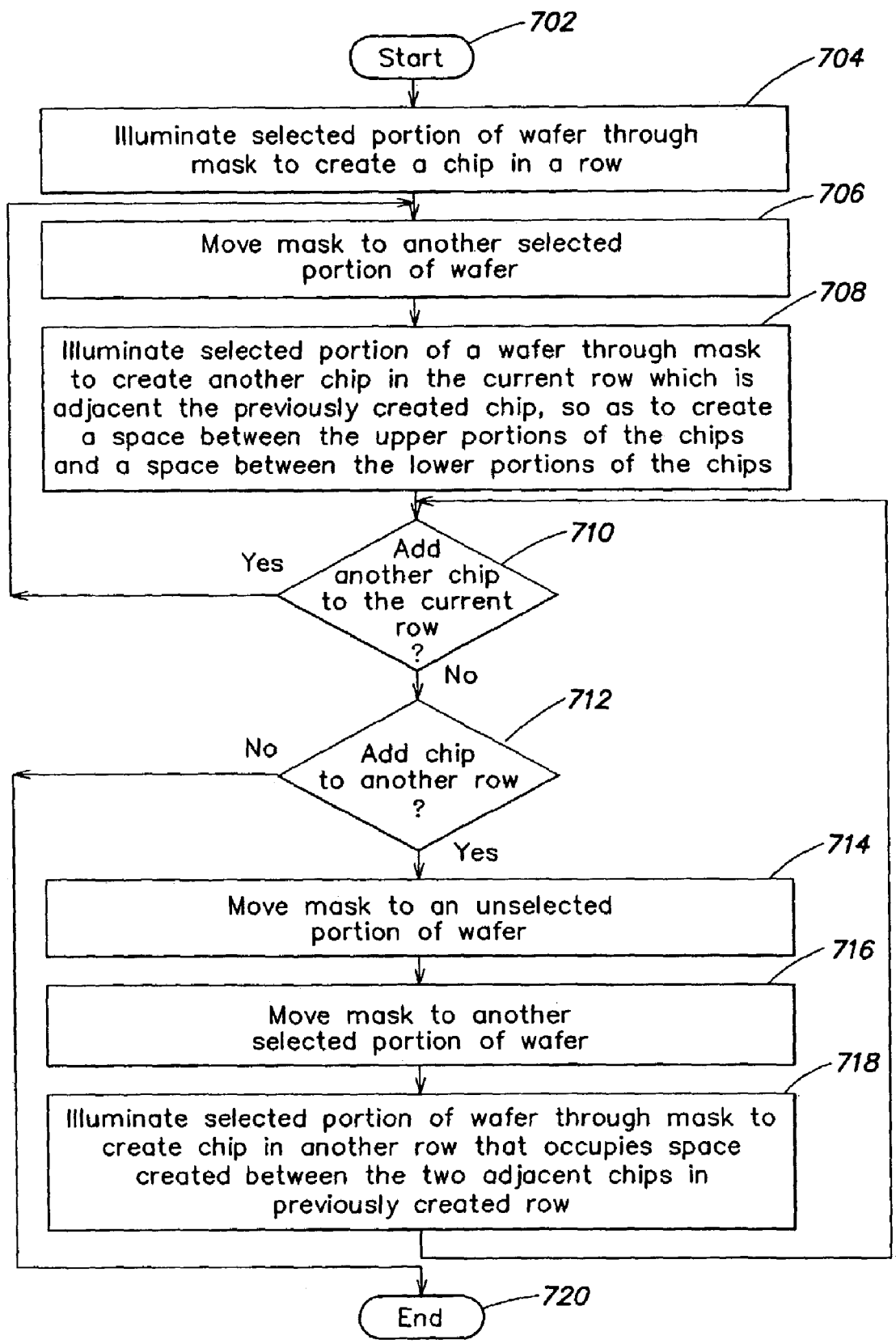
FIG. 7 is a flow chart describing an alternative inventive method of imaging chips on a wafer.

The use of the inventive mask 300, 400 is now described with reference to FIGS. 3-5 and with reference to FIG. 7, which illustrate in greater detail, an exemplary method of manufacturing chips. More specifically, FIG. 7 illustrates a method of manufacturing a row of diamond-shaped chips. In step 702, the method of manufacturing chips begins. In step 704, a selected portion of a wafer is illuminated through a mask 300 to create a chip in a row. For example, a selected portion of a wafer W may be illuminated through the mask 300 to create chip 514. The chip 514 has a first diagonal D1 which is horizontal and a second diagonal D2 which is vertical. In step 706, the mask 300 is moved a distance slightly greater than the first diagonal D1 in a direction parallel to the first diagonal D1, to a selected portion of the wafer W. For example, after creating chip 514, the mask 300, 400 is moved horizontally to the portion of the wafer where chip 518 will be located. In step 708, the selected portion of the wafer is illuminated through the mask 300, 400 to create another chip in the current row, which is adjacent the previously created chip, so as to create a space between the upper portions of the chips and a space between the lower portions of the chips. The same process may be repeated to create chip 520. For example, in step 708, chips 514, 518 and 520 will be created. The creation of chips 514, 518 and 520 in the first row creates a space between the upper right side of the chip 518 and the upper left side of the chip 520 and a space between the lower right side of chip 518 and the lower left side of chip 520. The first diagonals D1 of each chip in the row are aligned.

In step 710, if another chip is to be placed in the current row, step 706 and 708 are repeated. For example, a chip to the right of the chip 520 would be created in the first row. If another chip will not be placed in the same row, step 712 is performed. It will be determined in step 712 whether another chip is to be placed in another row. For example, it will be determined whether a chip will be placed in a second row. If a chip is to be added to another row, step 714 will be performed.

In step 714, the mask 300 is moved a distance slightly greater than half the length of the second diagonal D2 in a direction parallel to the second diagonal D2 to an unselected portion of the wafer. For example, after creating the chip 520, in step 714, the mask 300, 400 will be moved vertically a distance slightly greater than half the length of the second diagonal D2 of the chip image 302, 402. At this point, the second diagonal D2 of the chip image 302, 402 of the mask 300, 400 extends a distance D2 vertically from the center point of the chip 520. Because the mask is moved to an unselected portion of the wafer, a chip will not be created on the wafer at this point.

In step 716, the mask 300, 400 is moved a distance slightly greater than half the length of the first diagonal D1 in a direction parallel to the first diagonal D1 to a selected portion of the wafer W to position the mask for beginning illumination of a second row of diamond-shaped chips. For example, the mask 300, 400 will be moved horizontally a distance slightly greater than half the length of the first diagonal D1 of the chip image 302, 402 to occupy the space where the chip 528 is to be created. Because the movement performed in step 716 is to a selected portion, in step 718, the selected portion of the wafer is illuminated through the mask to create a chip in another row, such that a portion of the chip in this row occupies the space created between the two adjacent chips in the previously-created row. For example, in step 718, chip 528 will be created in a second row such that the lower portion of chip 528 occupies the space created between the upper right side of chip 518 and the upper left side of chip 520. It should be noted that during each step of FIG. 7 in which a selected portion of wafer is illuminated through the mask, blocking material of the mask may be used to prevent illumination from a portion of an exposure field EF from reaching the wafer. After step 718, step 718 is performed again. If another chip will be added to the current row, step 706 will be performed. However, if another chip will not be added to the current row, step 720 will be performed. In step 720, the method of FIG. 7 ends.

Although FIG. 7 describes in detail an exemplary method of manufacturing a row of chips, as described above, a plurality of alternative methods may be used to create chips on a wafer to create the layout shown in FIG. 5. Each of these alternate methods are similar to the method illustrated in FIG. 7.

Through the use of the methods shown in FIGS. 6 and 7, a plurality of chips may be created on a wafer in a manner that efficiently uses wafer space and reduces the maximum and average wiring of each chip and reduces congestion on each of the plurality of chips.

Although the methods and apparatus described in FIGS. 3-7 illustrated a mask with a diamond-shaped chip image, the mask may include a chip image with an alternative shape. The shape of the chip image included in a mask may be any n-sided polygon (e.g., a hexagon) that meshes well so as not to leave intermittent spaces (i.e., tiles), where n is an even number. The n-sided polygon-shaped chip image may have a plurality of sloped sides and at least one diagonal that is either horizontal or vertical. The n-sided polygon-shaped chip image may include a wiring direction, device orientation, and/or one or more rows of chip images that are parallel to the at least one diagonal.

The kerf image corresponding to such a chip image may be adjacent to one or more sides of the n-sided polygon-shaped chip image. The kerf image may include a wiring direction, device orientation, and/or one or more rows of kerf images that are parallel to the at least one diagonal. The mask that includes the alternate shaped chip image and kerf image may include blocking material that extends from the combined n-sided polygon-shaped chip image and kerf image to a periphery of an exposure field of a stepper. A chip manufactured from a mask with a n-sided polygon shaped chip image may include a diagonal that is horizontal or vertical and a centerline that is horizontal or vertical, wherein a centerline is a real or imaginary line that is equidistant from the sides of the polygon.

Figure 8:
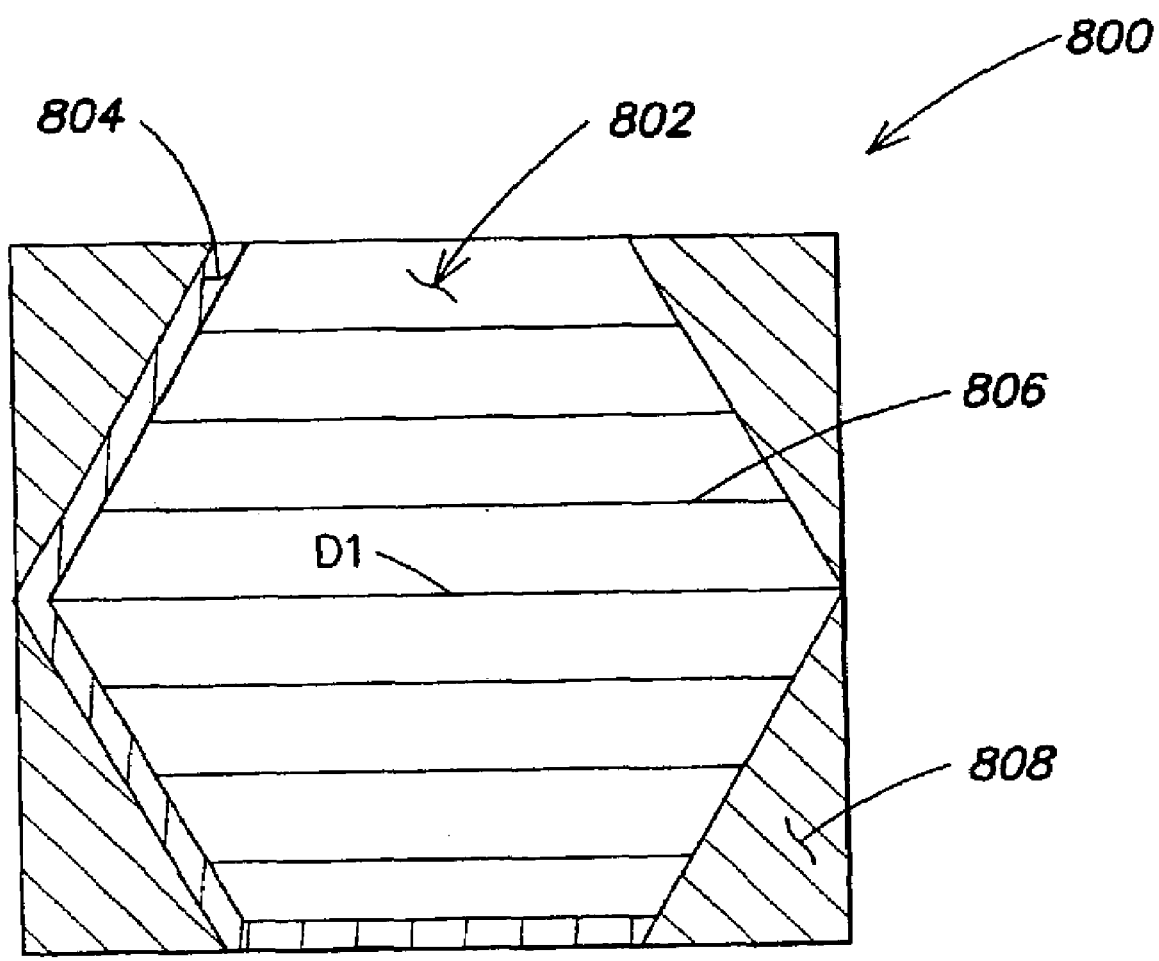
FIG. 8 shows an inventive mask that includes a regular hexagon-shaped chip image.

FIG. 8 illustrate an exemplary mask 800 that includes a regular hexagon-shaped chip image 802. The hexagon-shaped chip image includes a horizontal diagonal D1 and includes chip image rows of circuits 806 that are parallel to the diagonal D1. The mask 800 includes a kerf image 804 adjacent to three adjacent sides of the hexagon-shaped chip image 802.

Methods of manufacturing chips on a wafer using a mask that includes an n-sided polygon-shaped chip image are similar to the method of manufacturing chips on a wafer illustrated in FIGS. 6-7. When an n-sided polygon-shaped chip image is used, a first diagonal of the n-sided polygon shaped image may be either horizontal or vertical and the movements of the mask during chip manufacturing will be based upon the length of the first diagonal and be either parallel or perpendicular to the first diagonal.

Figure 9:
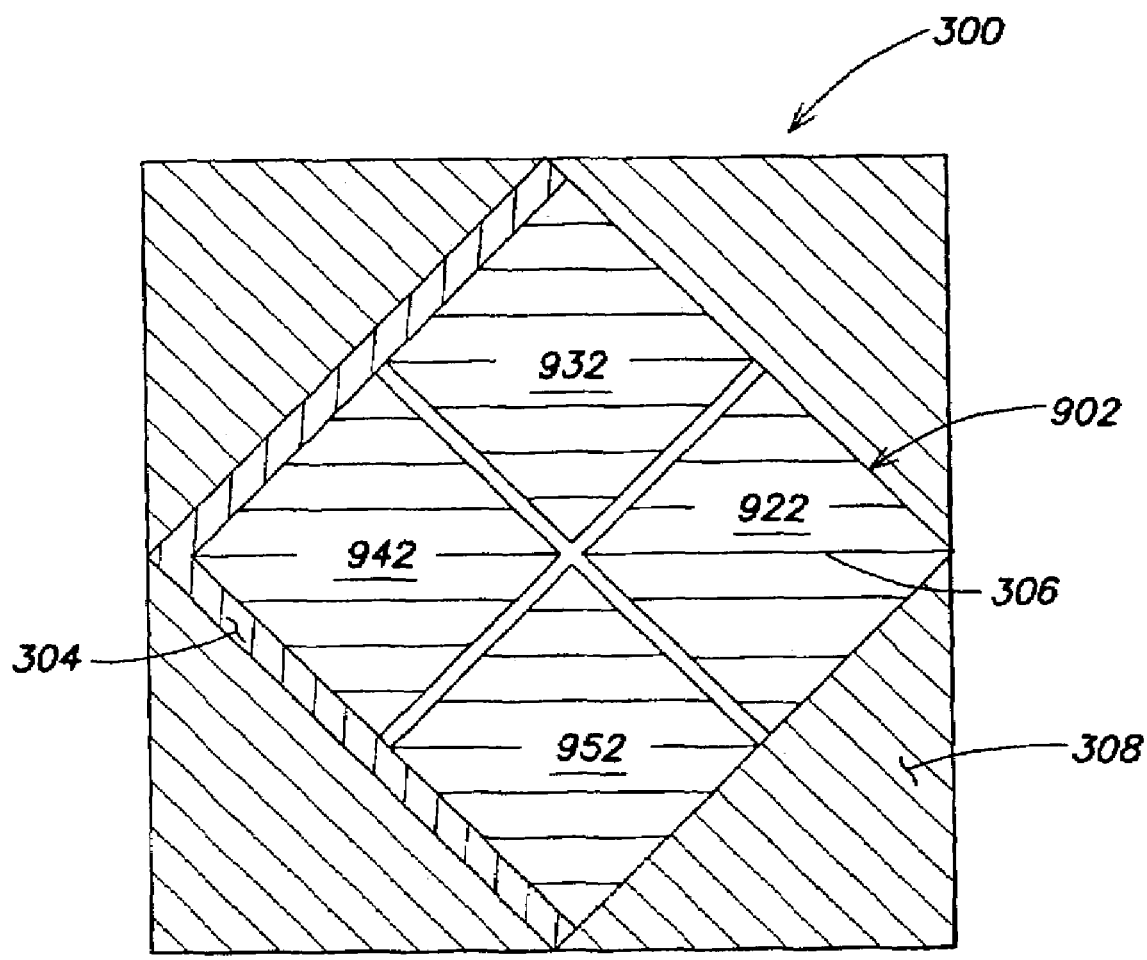
FIG. 9 shows an inventive mask including a plurality of diamond chip images.
Figure 10:
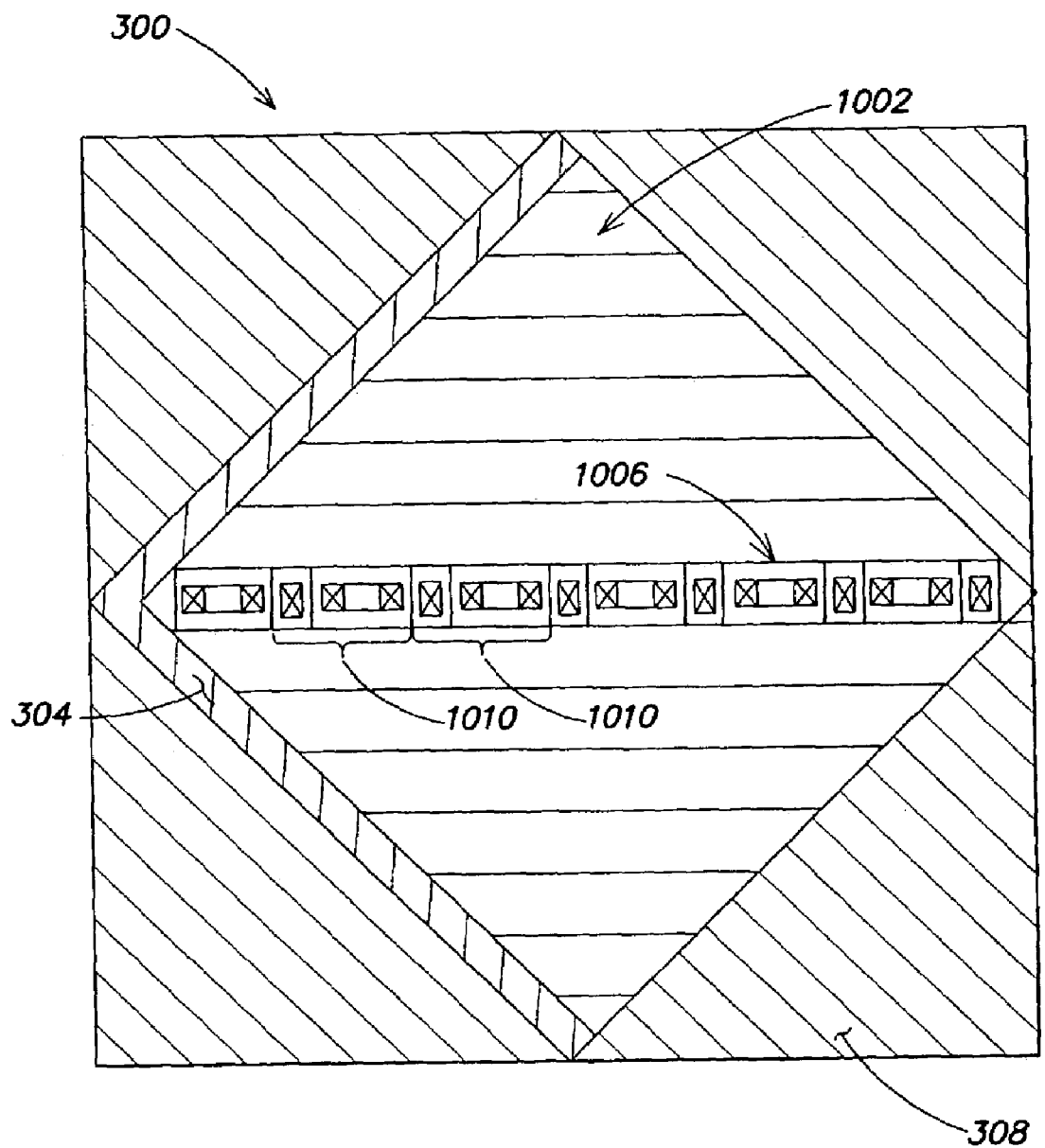
FIGS. 10 and 11 show a chip image row containing a plurality of transistors having a device orientation that is parallel to a horizontal diagonal of a chip, and having a device orientation that is parallel to a vertical diagonal of a chip, respectively.
Figure 11:
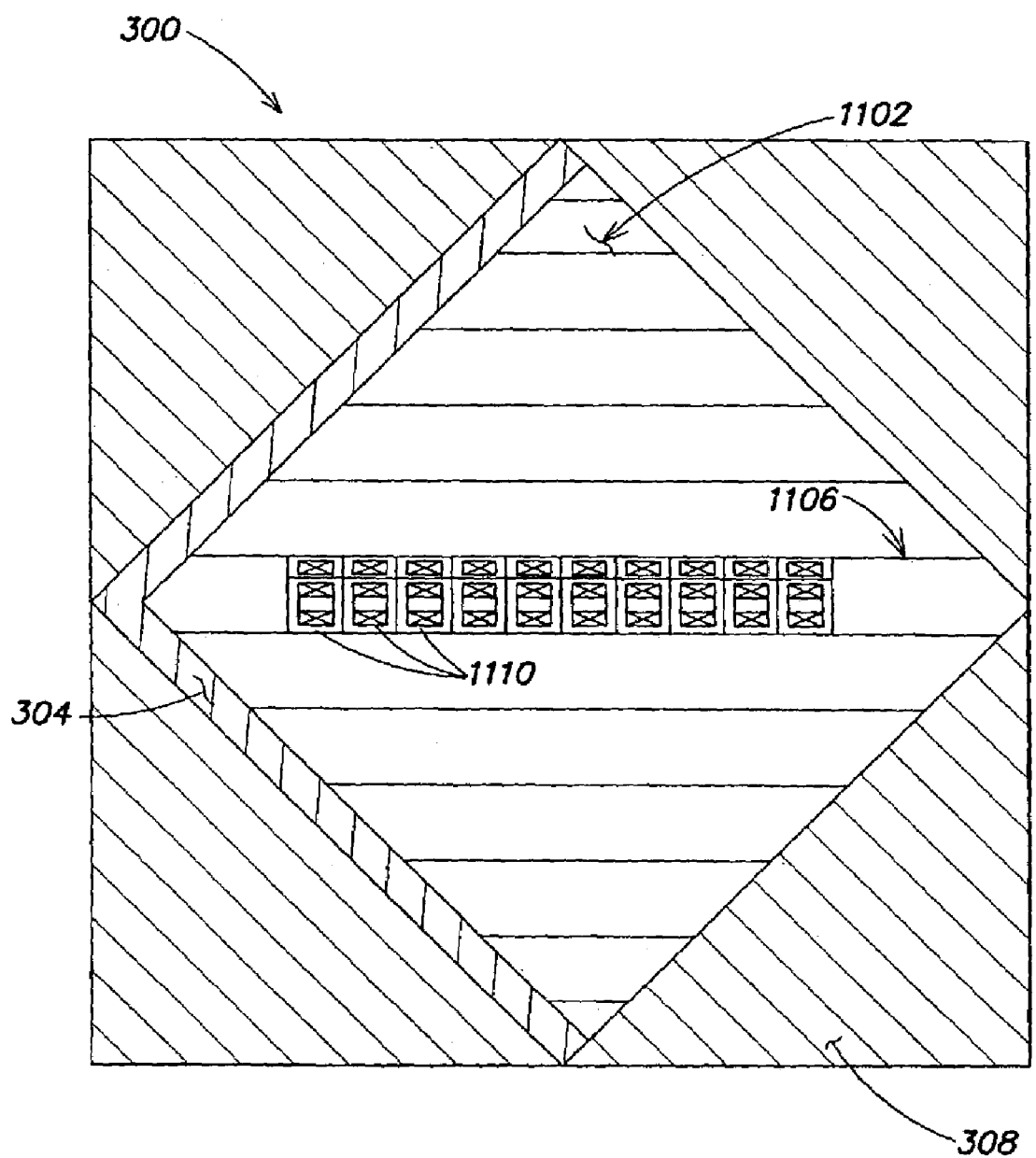
Figure 12:
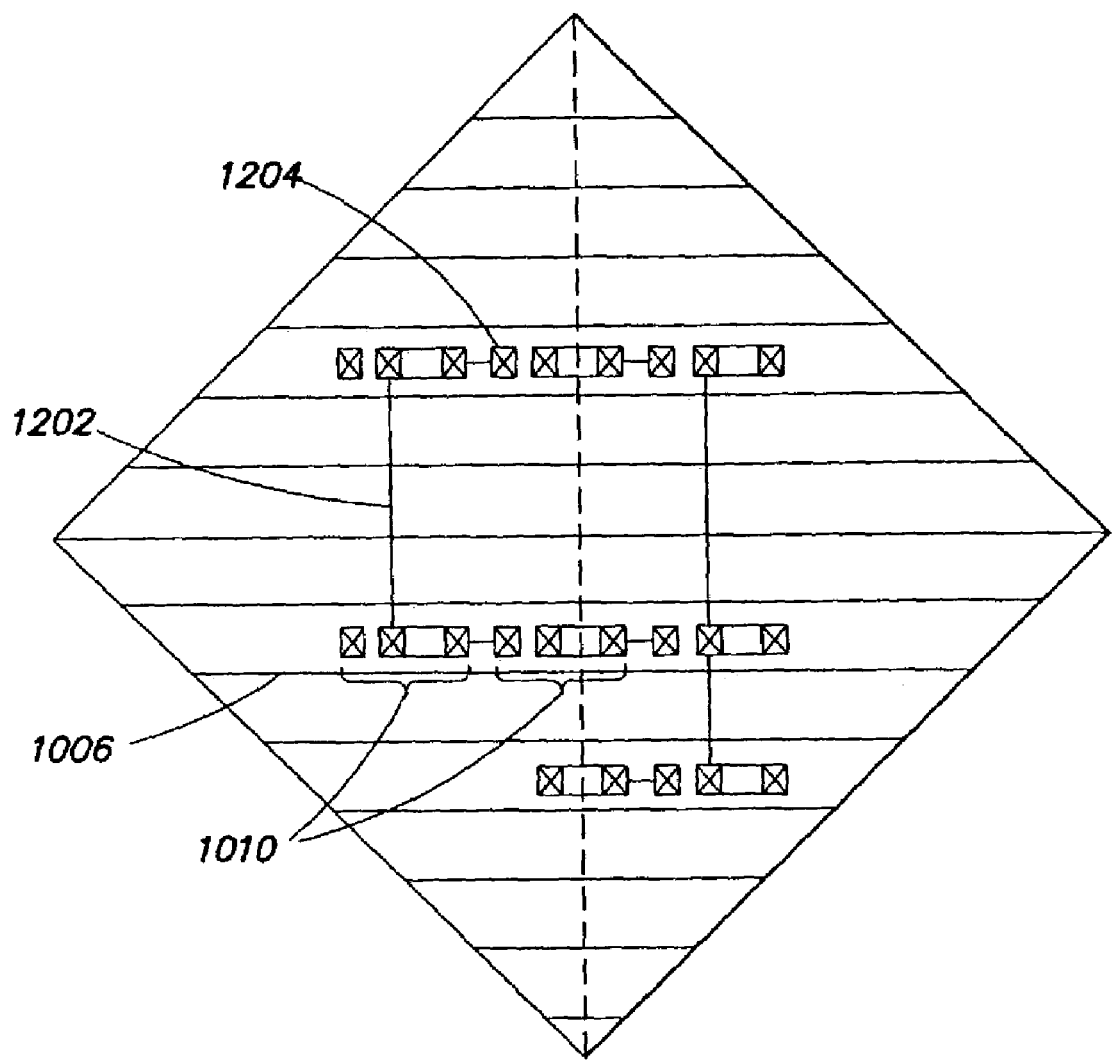
FIG. 12 illustrates a wiring direction of a chip created using the mask shown in FIG. 3 or 4.

The foregoing description discloses only exemplary embodiments of the invention. Modifications of the above disclosed apparatus and method which fall within the scope of the invention will be readily apparent to those of ordinary skill in the art. For instance, in the plurality of methods of manufacturing chips using a diamond-shaped chip image, when moving the mask Â½ the length of a diagonal to an unselected portion and then Â½ the length of another diagonal to a selected portion of the wafer to position the mask for beginning illumination of a second row (or column), the movement to the unselected portion may be horizontal and the movement to the selected portion may be vertical or the movement to the unselected portion may be vertical and the movement to the selected portion may be horizontal. In an embodiment shown in FIG. 9, a diamond image 902 of a mask may include a plurality of smaller diamond chip images 922, 932, 942, 952. The diamond image 902 may be cut to yield a plurality of smaller diamond chips. The same may be true of other shapes. FIG. 10 shows a chip image row 1006 containing a plurality of transistors (e.g., 1010) having a device orientation that is parallel to a horizontal diagonal of a chip, and FIG. 11 shows a chip image row 1106 containing a plurality of transistors (e.g., 1110) having a device orientation that is parallel to a vertical diagonal of a chip. FIG. 12 shows wiring lines 1202 and 1204 connecting the transistors 1010. Thus, FIG. 12 is useful in understanding device orientation and wiring direction.

Accordingly, while the present invention has been disclosed in connection with exemplary embodiments thereof, it should be understood that other embodiments may fall within the spirit and scope of the invention, as defined by the following claims.

The invention claimed is:

1. An apparatus for imaging a chip on a wafer comprising:
    a combined diamond chip image and kerf image, the combined diamond chip image and kerf image having a plurality of sloped sides and having:
        a diamond chip image comprising a plurality of chip image rows that are parallel to at least one of a first diagonal line and a second diagonal line of the diamond chip image; and
        a kerf image adjacent to the diamond chip image, the kerf image comprising at least one kerf image row that is parallel to the at least one of the first diagonal line and the second diagonal line of the diamond chip image; and
    a blocking material extending from the combined diamond chip image and kerf image to at least a periphery of an exposure field of a stepper.

2. The apparatus of claim 1 wherein the diamond chip image further comprises a wiring direction that is parallel to a diagonal line of the diamond chip image.

3. The apparatus of claim 1 wherein the diamond chip image further comprises a device orientation that is parallel to the at least one of the first and second diagonal line of the diamond chip image.

4. The apparatus of claim 3 wherein the kerf image comprises a device orientation that is parallel to the device orientation of the diamond chip image.

5. The apparatus of claim 1 wherein the kerf image is adjacent to a side of the diamond chip image.

6. The apparatus of claim 1 wherein the kerf image is along two adjacent sides of the diamond chip image.

7. The apparatus of claim 1 wherein the diamond chip image includes a plurality of smaller diamond chip images.

8. The apparatus of claim 1 wherein the blocking material extends from a sloped side of the combined diamond chip image and kerf image.

9. The apparatus of claim 1 wherein the blocking material prevents illumination, from a portion of the exposure field of the stepper, from reaching the wafer.

10. The apparatus of claim 1 wherein the chip image rows create a stairstep pattern at an edge of the chip.

11. A method of manufacturing chips comprising:
moving an apparatus for imaging a chip on a wafer to a plurality of selected portions of the wafer, the apparatus comprising:
a combined diamond chip image and kerf image, the combined diamond chip image and kerf image having a plurality of sloped sides and having:
a diamond chip image comprising a plurality of chip image rows that are parallel to at least one of a first diagonal line and a second diagonal line of the diamond chip image; and
a kerf image adjacent to the diamond chip image, the kerf image comprising at least one kerf image row that is parallel to the at least one of the first diagonal line and the second diagonal line of the diamond chip image; and
a blocking material extending from the combined of the diamond chip image and kerf image to at least a periphery of an exposure field of a stepper;
illuminating each of the plurality of selected portions of the wafer through the apparatus to create a plurality of diamondshaped chips;
wherein a first diagonal line of each chip is horizontal;
a second diagonal line of each chip is vertical; and
a first and a second adjacent row of chips are placed such that a portion of a chip in the second row occupies a space created between two adjacent chips in the first row.

12. The method of claim 11 wherein illuminating each of the plurality of selected portions of the wafer through the apparatus to create a plurality of diamondshaped chips includes illuminating each of the plurality of selected portions of the wafer through the apparatus after moving the apparatus for imaging a chip on a wafer to each of the plurality of selected portions.

13. The method of claim 11 wherein illuminating each of the plurality of selected portions of the wafer through the apparatus to create a plurality of diamond-shaped chips includes employing a blocking material to prevent illumination from a portion of an exposure field of a stepper from reaching the wafer.

14. The method of claim 11 wherein moving an apparatus for imaging a chip on a wafer to a plurality of selected portions of the wafer includes creating a first row of diamond-shaped chips via moving the apparatus for imaging a chip on a wafer a distance slightly greater than the first diagonal line in a direction parallel to the first diagonal line to a selected portion of the wafer, so as to create a first row of diamond shaped chips and thereafter,
moving the apparatus for imaging a chip on a wafer a distance slightly greater than half the length of the second diagonal line in a direction parallel to the second diagonal line to an unselected portion of the wafer; and
moving the apparatus for imaging a chip on a wafer a distance slightly greater than half the length of the first diagonal line in a direction parallel to the first diagonal line to a selected portion of the wafer, to position the mask for beginning illumination of a second row of diamond shaped chips.

15. The method of claim 14 wherein illuminating each of the plurality of selected portion of the wafer through the apparatus to create a plurality of diamond shaped chips including illuminating each of the plurality of selected portions of the wafer through the apparatus to create a plurality of diamond shaped chips after moving an apparatus for imaging a chip on a wafer to each of a plurality of selected portions.

16. The method of claim 14 wherein illuminating each of the plurality of selected portions of the wafer through the apparatus to create a plurality of diamond-shaped chips includes employing a blocking material to prevent illumination from a portion of the exposure field of a stepper from reaching the wafer.

17. The method of claim 11 wherein moving an apparatus for imaging a chip on a wafer to a plurality of selected portions of the wafer includes moving the apparatus for imaging a chip on a wafer a distance slightly greater than the first diagonal line in a direction parallel to the first diagonal line to a selected portion of the wafer;
moving the apparatus for imaging a chip on a wafer a distance slightly greater than half the length of the first diagonal line in a direction parallel to the first diagonal line to an unselected portion of the wafer; and
moving the apparatus for imaging a chip on a wafer a distance slightly greater than half the length of the second diagonal line in a direction parallel to the second diagonal line to a selected portion of the wafer.

18. The method of claim 11 wherein moving an apparatus for imaging a chip on a wafer to a plurality of selected portions of the wafer includes moving the apparatus for imaging a chip or a wafer a distance slightly greater then half the length of the first diagonal line in a direction parallel to the first diagonal line to an unselected portion of the wafer; and
moving the apparatus for imaging a chip on a wafer a distance slightly greater than half the length of the second diagonal line in a direction parallel to the second diagonal line to a selected portion of the wafer.

19. The method of claim 11 wherein moving an apparatus for imaging a chip on a wafer to a plurality of selected portions of the wafer includes moving the apparatus for imaging a chip on a wafer a distance slightly greater than the first diagonal line in a direction parallel to the first diagonal line to a selected portion of the wafer so as to create a first column of diamond shaped chips; and thereafter
moving the apparatus for imaging a chip on a wafer a distance slightly greater than half the length of the second diagonal line in a direction parallel to the second diagonal line to an unselected portion of the wafer; and
moving the apparatus for imaging a chip on a wafer a distance slightly greater than half the length of the first diagonal line in a direction parallel to the first diagonal line to a selected portion of the wafer so as to position the mask for beginning illumination of a second row of diamond shaped chips.

20. The method of claim 11 wherein moving an apparatus for imaging a chip on a wafer to a plurality of selected portions of the wafer includes moving the apparatus for imaging a chip on a wafer a distance slightly greater than the second diagonal line in a direction parallel to the second diagonal line to a selected portion of the wafer so as to create a first column of diamond shaped chips and thereafter,
moving the apparatus for imaging a chip on a wafer a distance slightly greater than half the length of the first diagonal line in a direction parallel to the first diagonal line to an unselected portion of the wafer; and
moving the apparatus for imaging a chip on a wafer a distance slightly greater than half the length of the second diagonal line in a direction parallel to the second diagonal line to a selected portion of the wafer, to position the mask for beginning illumination of a second column of diamond shaped chips.

21. A wafer having a plurality of n-sided polygon-shaped chips made in accordance with the method of claim 20.

22. The method of claim 11 wherein moving an apparatus for imaging a chip on a wafer to a plurality of selected portions of the wafer includes moving the apparatus for imaging a chip on a wafer a distance slightly greater than half the length of the second diagonal line in a direction parallel to the second diagonal line to an unselected portion of the wafer; and moving the apparatus for imagining a chip on a wafer a distance slightly greater than half the length of the first diagonal line in a direction parallel to the first diagonal line to a selected portion of the wafer.

23. A wafer having a plurality of diamond-shaped chips made in accordance with the method of claim 11.

* * * * *